United States Patent [19]

Tseng

[11] Patent Number: 5,677,217
[45] Date of Patent: Oct. 14, 1997

[54] METHOD FOR FABRICATING A MOSFET DEVICE, WITH LOCAL CHANNEL DOPING AND A TITANIUM SILICIDE GATE

[75] Inventor: Horng-Huei Tseng, Hsinchu, Taiwan

[73] Assignee: Vanguard International Semiconductor Corporation, Hsin-Chu, Taiwan

[21] Appl. No.: 691,287

[22] Filed: Aug. 1, 1996

[51] Int. Cl.[6] .................................................. H01L 21/265
[52] U.S. Cl. .............................. 437/45; 437/192; 437/200
[58] Field of Search ........................... 437/45, 192, 200

[56] References Cited

U.S. PATENT DOCUMENTS

| | | | |
|---|---|---|---|
| 5,322,809 | 6/1994 | Moslehi | 437/41 |
| 5,464,782 | 11/1995 | Koh | 437/41 |
| 5,468,662 | 11/1995 | Havemann | 437/40 |
| 5,489,543 | 2/1996 | Hong | 437/41 |

Primary Examiner—John Niebling
Assistant Examiner—Brendan Mee
Attorney, Agent, or Firm—George O. Saile; Stephen B. Ackerman

[57] ABSTRACT

A process has been developed in which a deep submicron MOSFET device has been fabricated, featuring a local, narrow threshold voltage adjust region, in a semiconductor substrate, with the narrow threshold voltage adjust region, self aligned to an overlying, narrow, polycide gate structure. The process consists of forming a narrow hole opening in an insulator layer, where the insulator layer overlies a polysilicon layer and a gate insulator layer. An ion implantation procedure, through the polysilicon layer, and gate insulator layer, is used to place a narrow threshold voltage adjust region in the specific area of the semiconductor substrate, underlying the narrow hole opening. Deposition of a metal layer, followed by an anneal procedure, converts the top portion of polysilicon, in the narrow hole opening, to a metal silicide structure. After removal of unreacted metal, and insulator layer, the polysilicon layer is patterned, via RIE procedures, using the metal silicide structure as a mask, to create a narrow polycide gate structure, comprised of an overlying, narrow metal silicide gate, and an underlying, narrow polysilicon gate structure. The narrow polycide gate structure is self aligned to the underlying, narrow threshold voltage adjust region.

27 Claims, 4 Drawing Sheets

METHOD FOR FABRICATING A MOSFET DEVICE, WITH LOCAL CHANNEL DOPING AND A TITANIUM SILICIDE GATE

BACKGROUND OF THE INVENTION (1) Field of the Invention

The present invention relates to a process in which metal oxide semiconductor field effect transistor, (MOSFET), devices are fabricated, and more specifically to a process used to fabricate MOSFET devices with local channel doping used to create a local threshold adjust regions.

(2) Description of Prior Art

The trend in the semiconductor industry has been to decrease the cost of semiconductor chips, specifically chips comprised of MOSFET devices, while also striving to improve the performance of the semiconductor chip, by improving the performance of an individual MOSFET device. These objectives have been in part realized via the ability of the semiconductor industry to utilize submicron features, micro-miniaturization, in semiconductor chips. The smaller device features allow the desired circuitry to be obtained on smaller chips, resulting in the ability to obtain more chips from a specific size starting substrate, thus reducing the fabrication costs of a specific chip. In addition smaller, or submicron features also result in performance benefits, via reductions in parasitic capacitance, realized with the use of submicron MOSFET regions.

The ability to achieve micro-miniaturization has been realized via advances in specific semiconductor fabrication disciplines, mainly photolithograhy and anisotropic dry etching. For example the use of more sophisticated exposure cameras, as well as the development of more sensitive photoresist materials, has resulted in the routine attainment of submicron images in photoresist layers. In turn the development of reactive ion etching, (RIE), tools and processes, have allowed the submicron images in photoresist layers to be easily transferred to underlying materials used in the fabrication of semiconductor devices. However the performance of MOSFET devices, created using submicron features, can still be increased via specific device engineering enhancements. For example MOSFET devices with channel lengths less then 0.35 uM, or deep submicron MOSFET devices, are now being fabricated, and do result in improved device performance. The smaller features of the deep submicron MOSFET device do result in a decrease in parasitic capacitances, which in turn results in a performance increase, when compared to MOSFET counterparts, fabricated with larger dimensions. However specific areas of the deep submicron MOSFET device remain, in which additional, undesired parasitic capacitance adversely influence performance.

The threshold voltage adjust region, created in the channel region of the MOSFET device, results in a significant level of junction capacitance, due to the increased doping level of the threshold adjust region. This threshold adjust region is usually placed in the channel region of the MOSFET device, spreading beyond the area needed for threshold voltage adjustment, thus adding unwanted junction capacitance. This invention will describe a fabrication method for creating deep submicron MOSFET devices, in which the unwanted junction capacitance, resulting from a threshold voltage adjust region, is reduced. This is accomplished by restricting the width of threshold voltage adjust region to a width identical to the width of a narrow polysilicon gate structure. The ability to self align the narrow polysilicon gate structure to a local threshold voltage adjust region, is accomplished via a unique processing procedure, featuring an ion implantation step, in a hole opened in an insulator layer, and through a blanket polysilicon, and gate insulator layer, creating the local threshold adjust region. A metal silicide formation, removal of unreacted metal, and definition of the polysilicon gate structure, using the metal silicide as a mask, result in the creation of the narrow polysilicon gate structure, self aligned to the local threshold voltage adjust region. Prior art such as Koh, in U.S. Pat No. 5,464,782, describes the formation of a threshold voltage adjust region in an opening in a insulator layer, followed by formation of a polysilicon gate structure, however Koh does not describe a process for self aligning, or restricting the threshold voltage adjust region, to a region directly underlying the polysilicon gate structure.

SUMMARY OF THE INVENTION

It is an object of this invention to fabricate a deep submicron MOSFET device using a local threshold voltage adjust region.

It is another object of this invention to create a local threshold voltage adjust region, in a semiconductor substrate, via an ion implantation of dopants through a blanket polysilicon layer, through a gate insulator layer, and into a local region of a semiconductor substrate, defined by a narrow hole opening, in an insulator layer.

It is still another object of this invention to convert a top portion of the polysilicon layer, exposed in the narrow hole opening in an insulator layer, to a metal silicide layer.

It is still yet another object of this invention to use the metal silicide layer as a mask, to define an underlying, narrow polysilicon gate structure, equal in width to the width of the narrow hole opening in an insulator layer, and self aligned to an underlying local threshold voltage adjust region.

In accordance with the present invention a process for fabricating a deep submicron MOSFET device, using a narrow polycide gate structure, self aligned to a local, narrow threshold voltage adjust region, is described. A gate insulator layer is thermally grown on the surface of a semiconductor substrate. A polysilicon layer is deposited, followed by the deposition of an insulator layer. Photolithographic and reactive ion etching, (RIE), procedures are used to create a narrow hole opening in the insulator layer, to expose the top surface of the polysilicon layer. An ion implantation procedure is performed, through the polysilicon layer, and through the gate insulator layer, in the narrow hole opening in the insulator layer, creating a local, narrow threshold adjust region in the channel region of the semiconductor substrate. A metal deposition, followed by an anneal, is used to convert a top portion of the polysilicon layer, exposed in the narrow hole opening in the insulator layer, to a metal silicide structure, while a bottom portion of the polysilicon layer, in the narrow hole opening, remains unreacted. The unreacted metal, on the surface of the insulator layer, is then removed, exposing the insulator layer, followed by removal of the insulator layer, exposing the top surface of the polysilicon layer, not covered by the metal silicide structure. The metal silicide structure is then used as a mask to define a narrow polysilicon gate structure, both directly overlying, and self aligned to, an underlying local, narrow threshold adjust region. Lightly doped source and drain regions are next formed, followed by the deposition of another insulator layer, and anisotropic RIE procedures, used to create an insulator spacer on the sides of the narrow metal silicide—polysilicon gate structure. Heavily doped source and drain regions are next formed followed by contact metallization procedures. (corrected line 4 and 9)

BRIEF DESCRIPTION OF THE DRAWINGS

The object and other advantages of this invention are best explained in the preferred embodiment with reference to the attached drawings that include.

DESCRIPTION OF THE PREFERRED EMBODIMENTS

Figure 1:
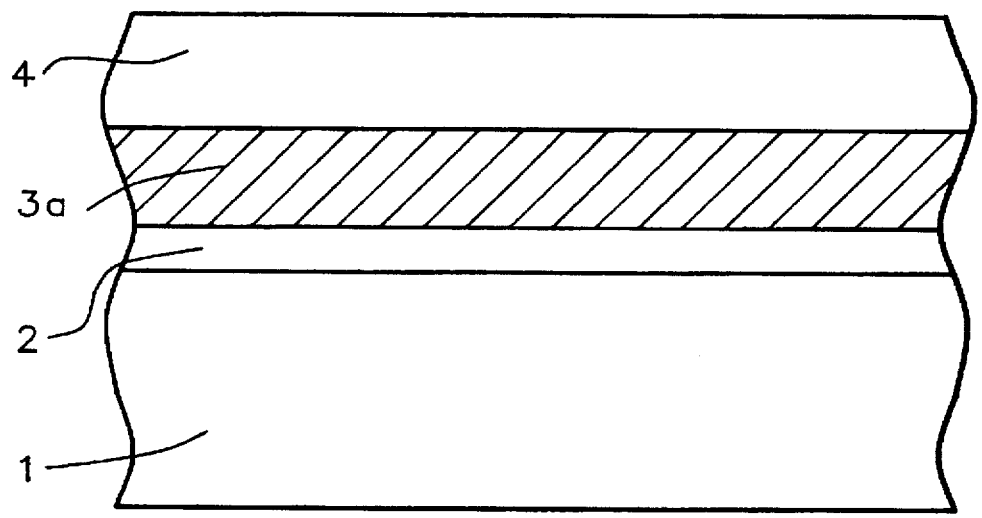
FIGS. 1–8, which schematically, in cross-sectional style, show the fabrication stages used to create a deep submicron MOSFET device, with a narrow metal silicide—narrow polysilicon gate structure, (polycide structure), self aligned to an underlying local threshold voltage adjust region.

The method for creating a deep submicron MOSFET device will now be covered in detail. Deep submicron is referred to as a dimension of less than 0.35 uM in width, and a deep submicron MOSFET device is referred to a MOSFET device with a submicron channel length of less than 0.35 uM. A P type, single crystalline silicon substrate, 1, with a <100> crystallographic orientation, shown in FIG. 1, is used. Field oxide regions, (not shown in the drawings), comprised of between about 4000 to 6000 Angstroms of thermally grown silicon dioxide, are formed for purposes of isolation. A silicon dioxide layer, 2, to be used as the gate insulator layer for the MOSFET device, is thermally grown on the top surface of semiconductor substrate, 1, in an oxygen—steam ambient, at a temperature between about 850° to 1000° C., to a thickness between about 50 to 200 Angstroms. A polysilicon layer, 3a, is next deposited, using low pressure chemical vapor deposition, (LPCVD), procedures, at a temperature between about 525° to 575° C., to a thickness between about 1500 to 3500 Angstroms. Polysilicon layer, 3a, can either be deposited intrinsically, and doped via ion implantation of phosphorous or arsenic, at an energy between about 25 to 75 KeV, at a dose between about 1E14 to 1E16 atoms/cm², or grown via insitu doping procedures by the addition of either arsine or phosphine to the silane ambient. Finally a insulator layer of silicon oxide, 4, is deposited using plasma enhanced chemical vapor deposition, (PECVD), procedures, at a temperature between about 300° to 400° C., to a thickness between about 1000 to 2000 Angstroms. FIG. 1, schematically shows these layers.

Figure 2:
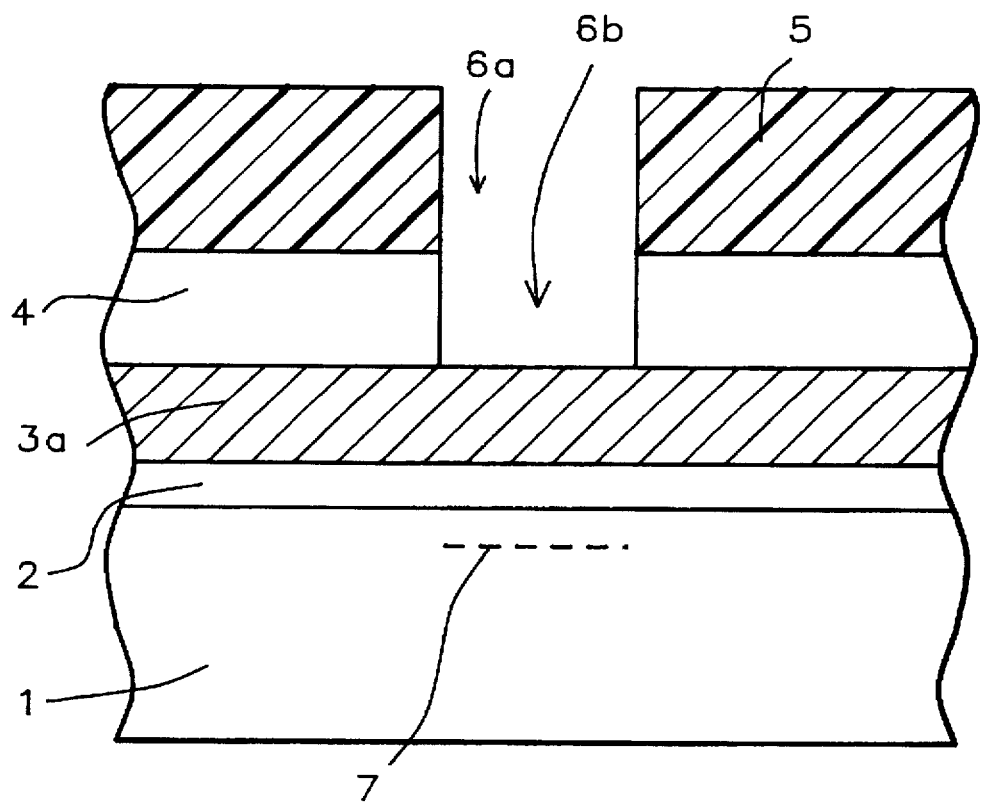

A photoresist layer, 5, with a narrow opening, or deep submicron opening, 6a, between about 0.20 to 0.50 uM, in width, is next formed on the surface of insulator layer, 4. A RIE procedure, using $CHF_3$ as an etchant, is next used to create a narrow hole opening, or a deep submicron hole opening, 6b, in insulator layer, 4, using the narrow opening 6a, in photoresist layer, 5, as a mask. This is shown schematically in FIG. 2. In this sequence the selectivity of the RIE procedure allows the etching procedure to terminate at the top surface of polysilicon layer, 3a, producing the narrow hole opening, 6b, with a width identical to the width of the narrow opening, 6a, in photoresist layer, 5, again between about 0.20 to 0.50 uM, in width.

A critical stage of this invention, the creation of a narrow, local threshold voltage adjust region, 7, is next addressed. An ion implantation of boron, at an energy between about 10 to 30 KeV, at a dose between about 1E11 to 1E13 atoms/c², is used to place threshold voltage adjust region, 7, in semiconductor substrate, 1. This critical ion implantation procedure is performed at an energy great enough to penetrate polysilicon layer, 3a, and gate insulator layer, 2, in narrow hole opening, 6b. The narrow, local threshold voltage adjust region, 7, is self aligned to the narrow hole opening, 6b, thus this narrow, local threshold voltage adjust region, 7, with only a narrow width of higher doping, will subsequently allow less junction capacitance to result then counterparts fabricated with wider, threshold voltage adjust regions. The width of local threshold voltage adjust region, 7, shown schematically in FIG. 2, is again between about 0.20 to 0.50 uM.

Figure 3:
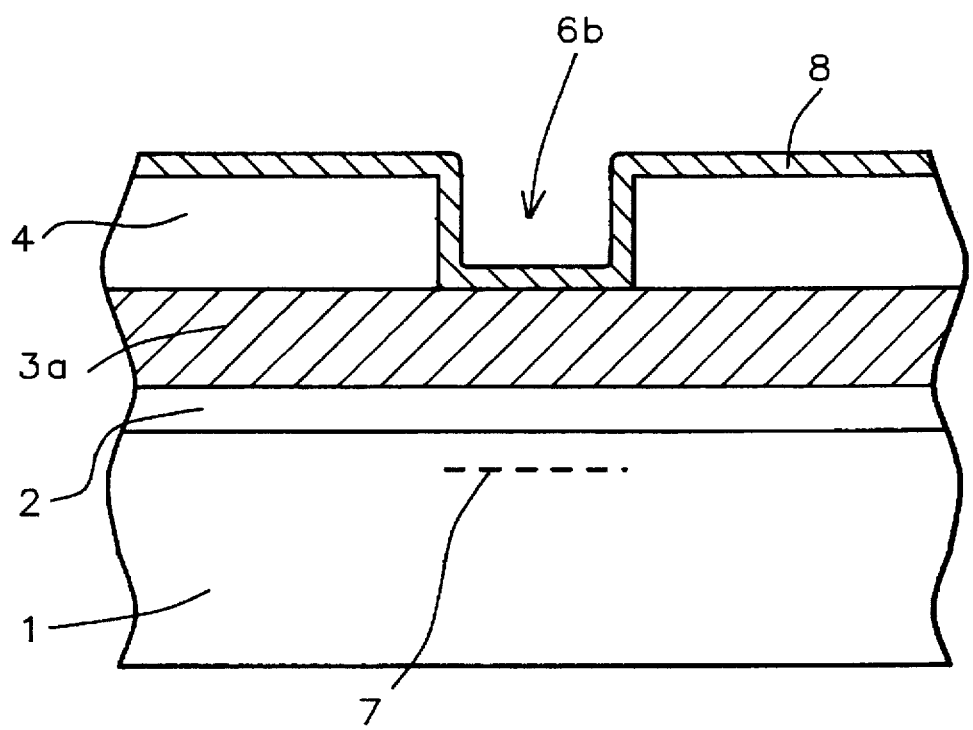
Figure 4:
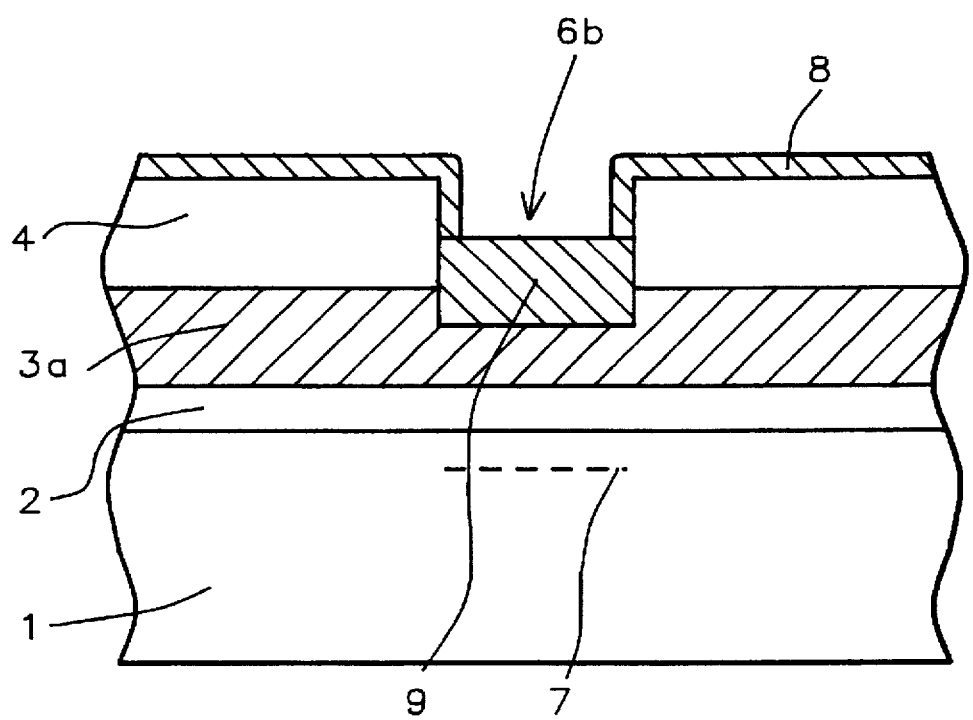

After removal of photoresist layer, 5, via plasma oxygen ashing and careful wet cleans, a layer of titanium, 8, is deposited on the exposed top surface of polysilicon layer, 3a, and on the top surface of insulator layer, 4, via r.f. sputtering procedures, to a thickness between about 300 to 1000 Angstroms. FIG. 3, schematically shows the result of this deposition. A rapid thermal anneal, (RTA), procedure is next performed at a temperature between about 750° to 950° C., for a time between about 20 to 60 sec. This procedure is used to convert a top portion of polysilicon layer, 3a, to a titanium silicide structure, 9. The anneal cycle is designed to form between about 600 to 2000 Angstroms of titanium silicide, 9, in narrow hole opening, 6b, while leaving between about 1000 to 2000 Angstroms polysilicon layer, 3a, unreacted, and underlying titanium silicide structure, 9, in the narrow hole opening, 6b. Titanium layer, 8, remains unreacted in regions in which titanium layer, 8, overlaid the top surface of insulator layer, 4. This is schematically shown in FIG. 4. The anneal used for titanium silicide formation can also be performed via use of conventional furnace techniques, at a temperature between about 600° to 750° C., for between about 10 to 60 min.

Figure 5:
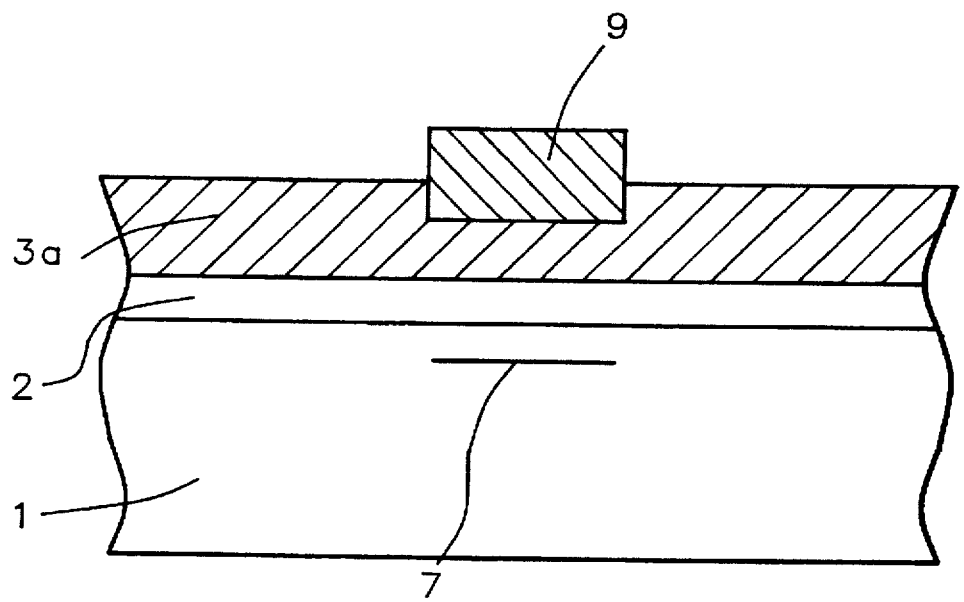
Figure 6:
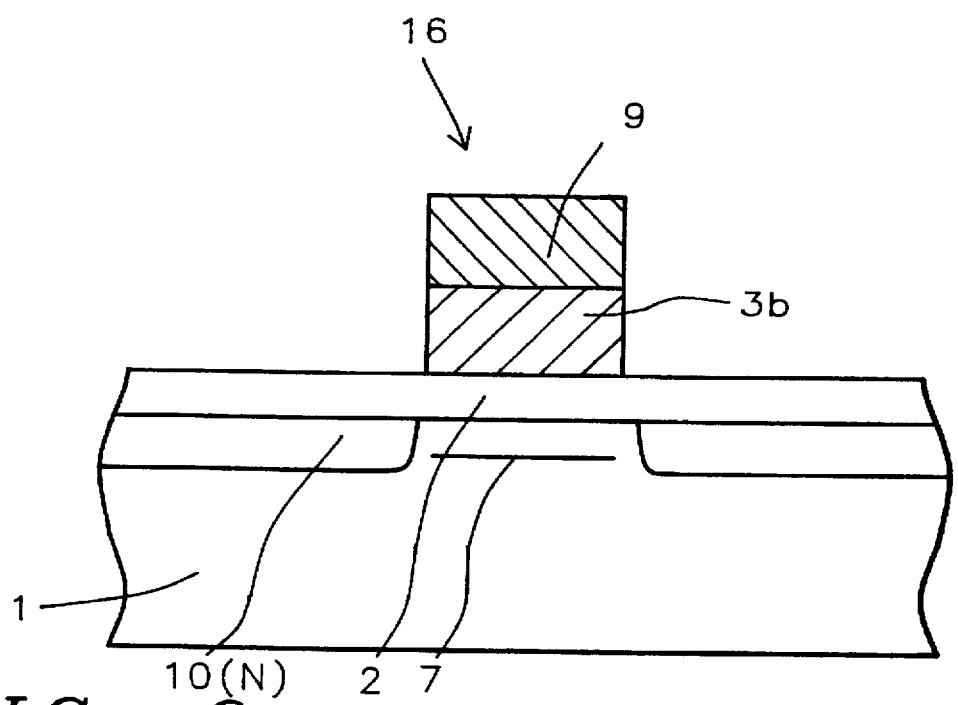

FIG. 5, schematically represents the stage of fabrication of MOSFET device, after removal of titanium layer, 8, and insulator layer, 4. First titanium layer, 8, is removed using a solution of $H_2O_2$—$H_2SO_4$, at a temperature between about 50° to 75° C. This selective wet etchant used to remove titanium layer, 9, does not remove exposed titanium silicide structure, 9. Next a buffered solution of hydrofluoric acid is used to remove insulator layer, 4. Again the etchant used to remove insulator layer, 4, did not remove exposed titanium silicide structure, 9. A RIE procedure, using HBr and $SF_6$ as an etchant, and titanium silicide structure, 9, as a mask, is used to remove polysilicon layer, 3a, from areas not covered by titanium silicide structure, 9, creating polysilicon gate structure, 3b. The selectivity of this RIE process results in complete removal of the unwanted regions of polysilicon layer, 3a, without significant attack of the overlying titanium silicide structure, 9. This is shown schematically in FIG. 6. The resulting narrow polycide gate structure, 16, of titanium silicide structure, 9,—polysilicon gate structure, 3b, is self aligned to the narrow, local threshold voltage adjust region, 7, with the narrow polycide gate structure, 16, having a width between about 0.20 to 0.50 uM. The titanium silicide component of the polycide structure, 16, reduces the resistance of the MOSFET device. The narrow polycide gate structure, 16, now allows a lightly doped source and drain region, 10, to be created, via an ion implantation of phosphorous, at an energy between about 20 to 40 KeV, at a dose between about 1E13 to 5E14 atoms/cm². This is also schematically shown in FIG. 6.

Figure 7:
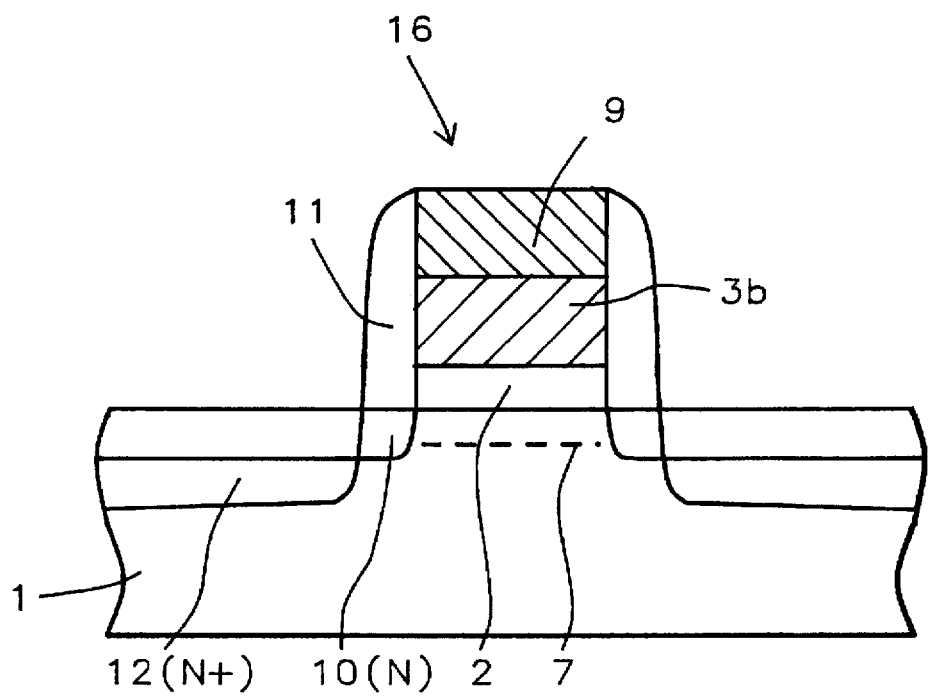
Figure 8:
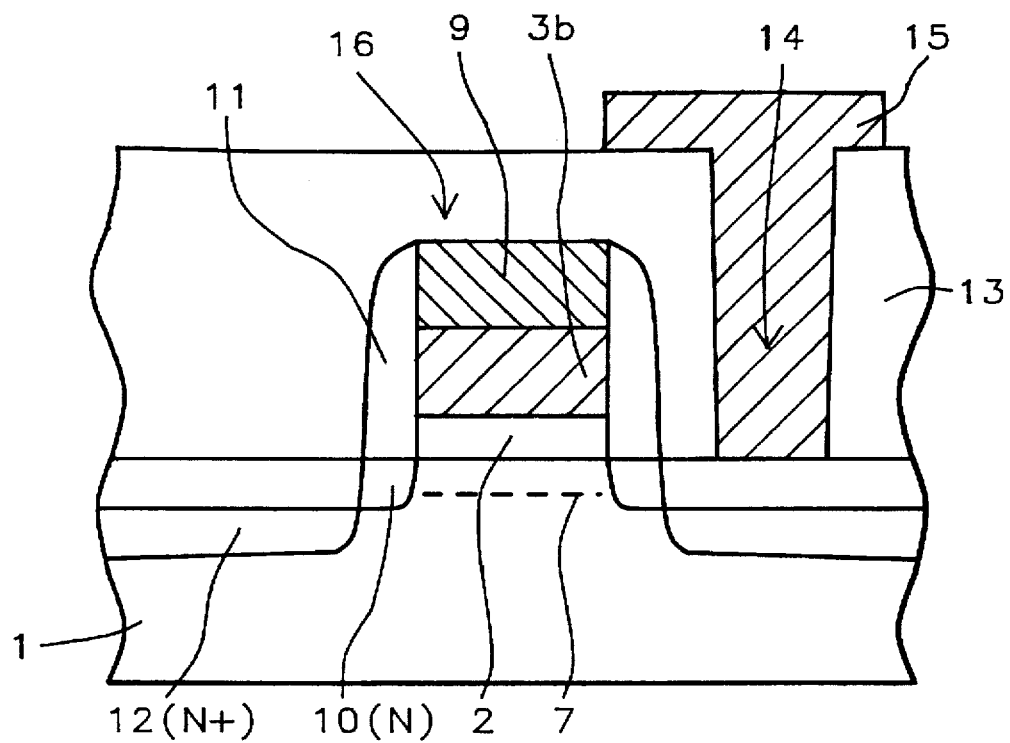

Another insulator layer of silicon oxide, is next deposited using LPCVD or PECVD procedures, at a temperature between about 720° to 750° C., to a thickness between about 1500 to 3000 Angstroms, using tetraethylorthosilicate, (TEOS), as a source. An anisotropic, RIE procedure, using $CHF_3$ as an etchant, is used to create insulator spacer, 11, schematically shown in FIG. 7. Also shown in FIG. 7, is the creation of a heavily doped source and drain region, 12, formed via ion implantation of arsenic at an energy between about 30 to 100 KeV, at a dose between about 1E15 to 3E16 atoms/cm². FIG. 8, schematically describes the processes used to create the metal contacts to the deep submicron MOSFET device. A silicon oxide layer, 13, is deposited using PECVD procedures, at a temperature between about 300° to 400° C., to a thickness between about 3000 to 8000 Angstroms. Conventional photolithographic and RIE procedures, using CHF₃ as an etchant, are used to create contact hole, 14, to heavily doped source and drain region, 12. An opening to narrow polycide gate structure, 16, is also created in silicon oxide layer, 13, however not shown in FIG. 8. The photoresist pattern, (not shown in FIG. 8), is then removed using plasma oxygen ashing and careful wet cleans. A metallization layer comprised of aluminum, containing between about 1 to 3% copper, and between about 0.5 to 2% silicon, is deposited using r.f. sputtering procedures, to a thickness between about 3000 to 8000 Angstroms. Conventional photolithographic and RIE procedures, using Cl₂ as etchant, are used to create metal contact structure, 15, shown schematically in FIG. 8. Photoresist removal is once again accomplished using plasma oxygen ashing and careful wet cleans.

This process for creating a deep submicron MOSFET device, using a narrow, local threshold voltage adjust region, although shown for the creation of an N channel, of NFET device can easily be used to create a P channel, or PFET device. This process can also be used to fabricate complimentary, (CMOS), or bipolar, (BiCMOS), devices.

While this invention has been particularly shown and described with reference to the preferred embodiments thereof, it will be understood by those skilled in the art that various changes in form and details may be made without departing from the spirit and scope of this invention.

What is claimed is:

1. A method of fabricating a MOSFET device, on a semiconductor substrate, with a narrow polycide gate structure, self aligned to a narrow local threshold voltage adjust region, comprising the steps of:

growing a first insulator layer, to be used as a gate insulator layer, on said semiconductor substrate;

depositing a polysilicon layer on said gate insulator layer;

depositing a second insulator layer on said polysilicon layer;

forming a photoresist pattern on said second insulator layer, with a narrow opening in said photoresist pattern, exposing top surface of said polysilicon layer;

forming a narrow hole opening, in said second insulator layer, by removing said second insulator layer from said narrow opening in said photoresist pattern;

ion implanting a first conductivity imparting dopant, through said polysilicon layer, through said gate insulator layer, and into an area of said semiconductor substrate, defined by said narrow hole opening, to create said narrow local threshold voltage adjust region;

depositing a first metal layer on the top surface of said second insulator layer, and on top surface of said polysilicon layer, exposed in said narrow hole opening in said second insulator layer;

annealing to convert a top portion of said polysilicon layer, exposed in said narrow hole opening, to a narrow metal silicide structure, overlying bottom portion of said polysilicon layer, in said narrow hole opening, while said metal layer, on top surface of said second insulator layer, remains unreacted;

removal of unreacted, said first metal layer, from the top surface of said second insulator layer;

removal of said second insulator layer, from the top surface of said polysilicon layer;

patterning of said polysilicon layer, using said narrow metal silicide structure as a mask, to create said narrow polycide gate structure, comprised of overlying, narrow metal silicide gate structure, and an underlying, narrow polysilicon gate structure, with said narrow polycide gate structure, overlying, and self aligned to, said narrow, local threshold voltage adjust region;

ion implanting a second conductivity imparting dopant into an area of said semiconductor substrate, not covered by said narrow polycide gate structure, to form a lightly doped source and drain region;

depositing a third insulator layer on said semiconductor substrate, and on said narrow polycide gate structure;

anisotropic etching of said third insulator layer, to form an insulator spacer on the sides of said narrow polycide gate structure; and ion implanting a third conductivity imparting dopant into an area of said semiconductor substrate, not covered by said narrow polycide gate structure, and not covered by said insulator spacer, to form a heavily doped source and drain region.

2. The method of claim 1, wherein said first insulator layer, used as said gate insulator layer, is silicon dioxide, thermally grown in an oxygen—steam ambient, at a temperature between about 850° to 1000° C., to a thickness between about 50 to 200 Angstroms.

3. The method of claim 1, wherein said polysilicon layer is deposited using LPCVD procedures, at a temperature between about 525° to 575° C., to a thickness between about 1500 to 3500 Angstroms.

4. The method of claim 1, wherein said second insulator layer is silicon oxide, deposited using PECVD procedures, at a temperature between about 300° to 400° C., to a thickness between about 1000 to 2000 Angstroms.

5. The method of claim 1, wherein said narrow opening, in said photoresist layer, is between about 0.20 to 0.50 uM, in width.

6. The method of claim 1, wherein said narrow hole opening, in said second insulator layer, is between about 0.20 to 0.50 uM, in width, formed via anisotropic RIE procedures, using CHF₃ as an etchant.

7. The method of claim 1, wherein said first conductivity imparting dopant, used to create said narrow local threshold adjust region, in an area of said semiconductor substrate defined by said narrow hole opening in said second insulator layer, is boron, ion implanted at an energy between about 10 to 30 KeV, at a dose between about 1E11 to 1E13 atoms/cm².

8. The method of claim 1, wherein said first metal layer is titanium, deposited via r.f. sputtering procedures, to a thickness between about 300 to 1000 Angstroms.

9. The method of claim 1, wherein rapid thermal anneal procedure is used at a temperature between about 750° to 950° C., for a time between about 20 to 60 sec., to result in the formation of said narrow metal silicide structure, between about 600 to 2000 Angstroms, formed from said top portion of said polysilicon layer, in said narrow hole opening, while leaving between about 1000 to 2000 Angstroms of said bottom portion of said polysilicon silicon layer, in said narrow hole opening, unreacted, remaining in said narrow hole opening.

10. The method of claim 1, wherein said narrow metal silicide structure is a titanium silicide structure.

11. The method of claim 1, wherein said metal layer is removed using $H_2O_2$ and $H_2SO_4$, at a temperature between about 50° to 75° C.

12. The method of claim 1, wherein said second insulator layer is removed using a buffered hydrofluoric acid solution.

13. The method of claim 1, wherein said polysilicon layer is patterned via RIE procedures, using HBr and $SF_6$ as etchants, creating said narrow polycide gate structure, with a width between about 0.20 to 0.50 uM, self aligned to said narrow, local threshold adjust region, and comprised of an overlying, said narrow titanium silicide gate structure, at a thickness between about 600 to 2000 Angstroms, and an underlying, said polysilicon gate structure, at a thickness between about 1000 to 2000 Angstroms.

14. The method of claim 1, wherein contact holes are opened in a fourth insulator layer, to said heavily doped source and drain region and to said narrow polycide gate structure, followed by deposition of an aluminum based metallization layer, and patterning of said aluminum based metallization layer to form metal contacts to said heavily doped source and drain regions, and to said narrow polycide gate structure.

15. A method of fabricating a deep, submicron MOSFET device, on a semiconductor substrate, with a narrow polycide gate structure, self aligned to a narrow local threshold voltage adjust region, comprising the steps of:

growing a first insulator layer, to be used as a gate insulator layer, on said semiconductor substrate;

depositing a polysilicon layer on said gate insulator layer;

depositing a second insulator layer on said polysilicon layer;

forming a photoresist pattern on said second insulator layer, with a deep submicron opening in said photoresist pattern, exposing top surface of said polysilicon layer;

forming a deep submicron hole opening, in said second insulator layer, by removing said second insulator layer, from an area defined by said deep submicron opening in said photoresist pattern;

ion implanting a first conductivity imparting dopant through said polysilicon layer, through said gate insulator layer, and into an area of said semiconductor substrate, defined by said deep submicron hole opening, to create said narrow local threshold voltage adjust region;

depositing a titanium layer on top surface of said second insulator layer, and on top surface of said polysilicon layer, exposed in said deep submicron hole opening, in said second insulator layer;

annealing to convert a top portion of said polysilicon layer, exposed in said deep submicron hole opening, to a narrow titanium silicide structure, overlying bottom portion of said polysilicon layer, in said deep submicron hole opening, while said titanium layer, on top surface of said second insulator layer, remains unreacted;

removal of unreacted, said titanium layer from the top surface of said second insulator layer;

removal of said second insulator layer, from the top surface of said polysilicon layer;

removal of said polysilicon layer, not covered by said narrow titanium silicide structure, to create said narrow polycide gate structure, comprised of an overlying, narrow titanium silicide gate structure, and an underlying, narrow polysilicon gate structure, with said narrow polycide gate structure, overlying, and self aligned to, said narrow, local threshold voltage adjust region;

ion implanting a second conductivity imparting dopant into an area of said semiconductor substrate, not covered by said narrow polycide gate structure, to form a lightly doped source and drain region;

depositing a third insulator layer on said semiconductor substrate, and on said narrow polycide gate structure;

anisotropic etching of said third insulator layer to form an insulator spacer on the sides of said narrow polycide gate structure; and ion implanting a third conductivity imparting dopant into an area of said semiconductor substrate, not covered by said narrow polycide gate structure, and not covered by said insulator spacer, to form a heavily doped source and drain region.

16. The method of claim 15, wherein said first insulator layer, used as said gate insulator layer, is silicon dioxide, thermally grown, in an oxygen—steam ambient, at a temperature between about 850° to 1000° C., to a thickness between about 50 to 200 Angstroms.

17. The method of claim 15, wherein said polysilicon layer is deposited using LPCVD procedures, at a temperature between about 525° to 575° C., to a thickness between about 1500 to 3500 Angstroms.

18. The method of claim 15, wherein said second insulator layer is silicon oxide, deposited using PECVD procedures, at a temperature between about 300° to 400° C., to a thickness between about 1000 to 2000 Angstroms.

19. The method of claim 15, wherein said deep submicron opening, in said photoresist layer, is between about 0.20 to 0.50 uM, in width.

20. The method of claim 15, wherein said deep submicron hole opening, in said second insulator layer, is between about 0.20 to 0.50 uM, in width, formed via anisotropic RIE procedures, using $CHF_3$ as an etchant.

21. The method of claim 15, wherein said first conductivity imparting dopant, used to create said narrow local threshold voltage adjust region, in an area of said semiconductor substrate defined by said deep submicron hole opening, is boron, ion implanted at an energy between about 10 to 30 KeV, at a dose between about 1E11 to 1E13 atoms/cm$^2$.

22. The method of claim 15, wherein said titanium layer is deposited using r.f. sputtering procedures, to a thickness between about 300 to 1000 Angstroms.

23. The method of claim 15, wherein a rapid thermal anneal procedure is used at a temperature between about 750° to 950° C., for a time between about 20 to 60 sec., to result in the formation of said narrow titanium silicide structure, between about 600 to 2000 Angstroms, formed from said top portion of said polysilicon layer, in said deep submicron hole opening, while leaving between about 1000 to 2000 Angstroms of said bottom portion of said polysilicon layer, in said deep submicron hole opening, unreacted, and remaining in said deep submicron hole opening.

24. The method of claim 15, wherein said titanium layer is removed using a solution of $H_2SO_4$, and $H_2O_2$, at a temperature between about 50° to 75° C.

25. The method of claim 15, wherein said second insulator layer is removed using a buffered hydrofluoric acid solution.

26. The method of claim 15, wherein said polysilicon layer is removed via RIE procedures, using HBr and $SF_6$ as an etchants, creating said narrow polycide gate structure, with a width between about 0.20 to 0.50 uM, self aligned to underlying, said narrow local threshold voltage adjust region, and comprised of overlying, said narrow titanium silicide gate structure, at a thickness between about 600 to 2000 Angstroms, and underlying, said narrow polysilicon gate structure, at a thickness between about 1000 to 2000 Angstroms.

27. The method of claim 15, wherein contact holes are opened in a silicon oxide layer, to said heavily doped source and drain region, and to said narrow titanium silicide gate structure, followed by the deposition of an aluminum—copper—silicon metallization layer, and patterning to create an aluminum—copper—silicon contact structure, to said heavily doped source and drain region, and to said narrow titanium silicide gate structure.

* * * * *